(12) United States Patent
Herrera et al.

(10) Patent No.: US 7,800,445 B2
(45) Date of Patent: Sep. 21, 2010

(54) LOW HEADROOM X-BRIDGE TRANSCONDUCTOR

(75) Inventors: Sandro Herrera, Somerville, MA (US); Stefano D'Aquino, Westford, MA (US)

(73) Assignee: Analog Devices, Inc., Norwood, MA (US)

( * ) Notice: Subject to any disclaimer, the term of this patent is extended or adjusted under 35 U.S.C. 154(b) by 50 days.

(21) Appl. No.: 12/207,082

(22) Filed: Sep. 9, 2008

(65) Prior Publication Data

US 2010/0060359 A1     Mar. 11, 2010

(51) Int. Cl.
*H03F 3/45*     (2006.01)

(52) U.S. Cl. ...................................... 330/252
(58) Field of Classification Search ................. 330/252, 330/253
See application file for complete search history.

(56) References Cited

U.S. PATENT DOCUMENTS 6,069,523 A * 5/2000 Brown ......................... 327/563

* cited by examiner

*Primary Examiner*—Steven J Mottola
(74) *Attorney, Agent, or Firm*—Sunstein Kann Murphy & Timbers LLP

(57) ABSTRACT

A transconductance cell includes a positive rail for providing a positive power supply voltage and a negative rail for providing a negative power supply voltage. A pair of voltage inputs, one inverting and one non-inverting, develop a differential voltage input signal having a common mode voltage range from one of the rail voltages to within a volt or less of the other rail voltage. And a pair of cross-coupled transconductor circuits each have: (i.) a source voltage follower responsive to one of the voltage inputs for sourcing relatively unbounded output current at unity voltage gain, (ii.) a sink voltage follower responsive to the other voltage input for sinking unbounded output current to a current output terminal, and (iii) a transconductance resistor connected between the source voltage follower and the sink voltage follower for developing a differential output current proportional to the differential voltage input signal. Transconductance of the cell is substantially constant over the range of the differential voltage input signal without limiting the differential output current.

12 Claims, 5 Drawing Sheets

LOW HEADROOM X-BRIDGE TRANSCONDUCTOR

FIELD OF THE INVENTION

The present invention relates to analog electronic circuits, and more specifically to an input stage for an operational amplifier (op-amp).

BACKGROUND ART

The input stage of an operational amplifier is typically a differential transconductance cell that produces an output current in proportion to the applied input differential voltage: $I_{OUT}=g_m(V_P-V_N)$ where $g_m$ is referred to as transconductance, and $V_P$ and $V_N$ are referred to as the cell's voltage inputs. In a transconductance cell, the output current relationship holds for a given range of input common mode voltages defined as $V_{ICM}=(V_P+V_N)/2$. Outside this input common mode voltage range, the transconductance of the cell becomes non-linear or non-constant. The input common mode voltage range of a transconductance cell should be as large as possible since it allows the most efficient use of the power supplies.

Another limitation of a differential transconductance cell is the maximum output current it can supply: $I_{OUT\ MAX}$. This maximum output current usually dictates the slew rate of the operational amplifier. High slew rate is generally desired in most operational amplifier applications.

FIG. 1 shows an example of a prior art, a folded cascode transconductance cell. This transconductance cell is widely known in industry and is often used as an operational amplifier input stage. Input voltage signals $V_P$ and $V_N$ are applied to the bases of differential pair PNP transistors Q101 and Q102 and the output current is measured at the collectors of transistors Q103 and Q104, nodes $I_{OP}$ and $I_{ON}$. Q100 is a current source which provides fixed current to the emitters of transistors Q101 and Q102.

The folded cascode transconductance cell has a very wide input common mode range. The input common mode voltage can go beyond one the power rails ($V_{EE}$ in FIG. 1) and up to $V_{RT}+V_{Q101BE}+V_{Q100CEsat}$ from the other power rail ($V_{CC}$ in FIG. 1). $V_{RT}$ refers to voltage across resistor $R_T$ and $V_{BE}$ refers to the base-emitter voltage of a bipolar transistor. The maximum output current of this input stage is limited by the tail current source, Q100, of the PNP differential pair Q101 and Q102. Therefore, $I_{OUT\ MAX}=I_{CQ100}$.

FIG. 2 shows an example of another prior art, the X-Bridge transconductor. Q201/Q203/Q205 and Q207 form two unity gain voltage buffers for the positive input voltage $V_P$ and Q202/Q204/Q206 and Q208 form another two unity gain voltage buffers for the negative input voltage $V_N$. These buffers apply the differential input voltage ($V_P-V_N$) across resistors RX which in turn produce the output current $$I_{OUT} = \frac{(V_P - V_N)}{R_X}$$

The maximum output current of the X-bridge transconductor is limit by the base current of transistors Q205 and Q206 along with the quiescent current of current source transistors Q200a and Q200b. The theoretical maximum output current for this cell is $BETA*I_{CQ200}$, where BETA refers to the current gain of a Bipolar transistor.

Compared to the folded cascode transconductance cell, the X-bridge transconductor has a relatively narrow input common mode range. Like the folded cascode cell, the common mode input voltage can go beyond one of the power rails ($V_{EE}$ in FIG. 2), but only up to $V_{RT}+2*V_{BE}+V_{CEsat}$ from the other ($V_{CC}$ in FIG. 2). Thus, the input common mode voltage range is smaller than the one for the folded cascode by one $V_{BE}$.

SUMMARY OF THE INVENTION

A transconductance cell input circuit for an operational amplifier has a high input common mode voltage range and offers high output currents with enhanced slew rate characteristics. A positive rail provides a positive power supply voltage and a negative rail provides a negative power supply voltage. A pair of voltage inputs, one inverting and one non-inverting, develop a differential voltage input signal having a common mode voltage range from one of the rail voltages to within a volt or less of the other rail voltage. And a pair of cross-coupled transconductor circuits each having: (i.) a source voltage follower responsive to one of the voltage inputs for sourcing relatively unbounded output current at unity voltage gain, (ii.) a sink voltage follower responsive to the other voltage input for sinking relatively unbounded output current to a current output terminal, and (iii.) a transconductance resistor connected between the source voltage follower and the sink voltage follower for developing a differential output current proportional to the differential voltage input signal. Transconductance of the cell is substantially constant over the range of the differential voltage input signal without limiting the differential output current.

In further specific embodiments, the source voltage follower is responsive to one of the voltage inputs based on an active local feedback arrangement. The cross-coupled transconductor circuit may be based on differential pair arrangements of transistor devices, and the transconductance cell may specifically be an input stage for an operational amplifier device.

Embodiments of the present invention also include related methods for developing an input signal for an electronic device. A positive power supply voltage is provided at a positive rail and a negative power supply voltage is provided at a negative rail. A pair of voltage inputs, one inverting and one non-inverting, develop a differential voltage input signal having common mode voltage range from one of the rail voltages to within a volt or less of the other rail voltage. And a pair of cross-coupled transconductor circuits each having: (i.) a source voltage follower responsive to one of the voltage inputs for sourcing relatively unbounded output current at unity voltage gain, (ii.) a sink voltage follower responsive to the other voltage input for sinking relatively unbounded output current to a current output terminal, and (iii.) a transconductance resistor connected between the source voltage follower and the sink voltage follower for developing a differential output current proportional to the differential voltage input signal. Transconductance of the cell is substantially constant over the range of the differential voltage input signal without limiting the differential output current.

In further specific embodiments, an active local feedback arrangement is used by the source voltage follower to be responsive to one of the voltage inputs. Differential pair arrangements of transistor devices may be used for the cross-coupled transconductor circuits. And the transconductance cell may be an input stage for an operational amplifier device.

Embodiments of the present invention also include an input circuit for an electronic device having means for providing a positive power supply voltage at a positive rail, and means for providing a negative power supply voltage at a negative rail. Means for developing at a pair of voltage inputs, one inverting and one non-inverting, a differential voltage input signal having a common mode voltage range between one of the rail voltages to within a volt or less of the other rail voltage. Means for providing a pair of cross-coupled transconductor circuits each having: (i.) a source voltage follower responsive to one of the voltage inputs for sourcing relatively unbounded output current at unity voltage gain, (ii.) a sink voltage follower responsive to the other voltage input for sinking relatively unbounded output current to a current output terminal, and (iii.) a transconductance resistor connected between the source voltage follower and the sink voltage follower for developing a differential output current proportional to the differential voltage input signal. Transconductance of the cell is substantially constant over the range of the differential voltage input signal without limiting the differential output current.

In further specific embodiments, the source voltage follower may include means for providing active local feedback to be responsive to one of the voltage inputs. The cross-coupled transconductor circuits may be based on differential pair arrangements of transistor devices. And the transconductor cell may be an input stage of an operational amplifier device.

DETAILED DESCRIPTION OF SPECIFIC EMBODIMENTS

Various embodiments of the present invention are directed to an input trans-conductance cell for an operational amplifier that provides high dynamic output currents while having a high input common mode range. The input common mode voltage can range beyond that of one of the power rails and within $V_{RT}+V_{BE}+V_{CEsat}$ (about a volt or less) of the other power rail. Embodiments of the presented transconductance cell also can provide high output currents that are not limited by a fixed current source.

Figure 1:
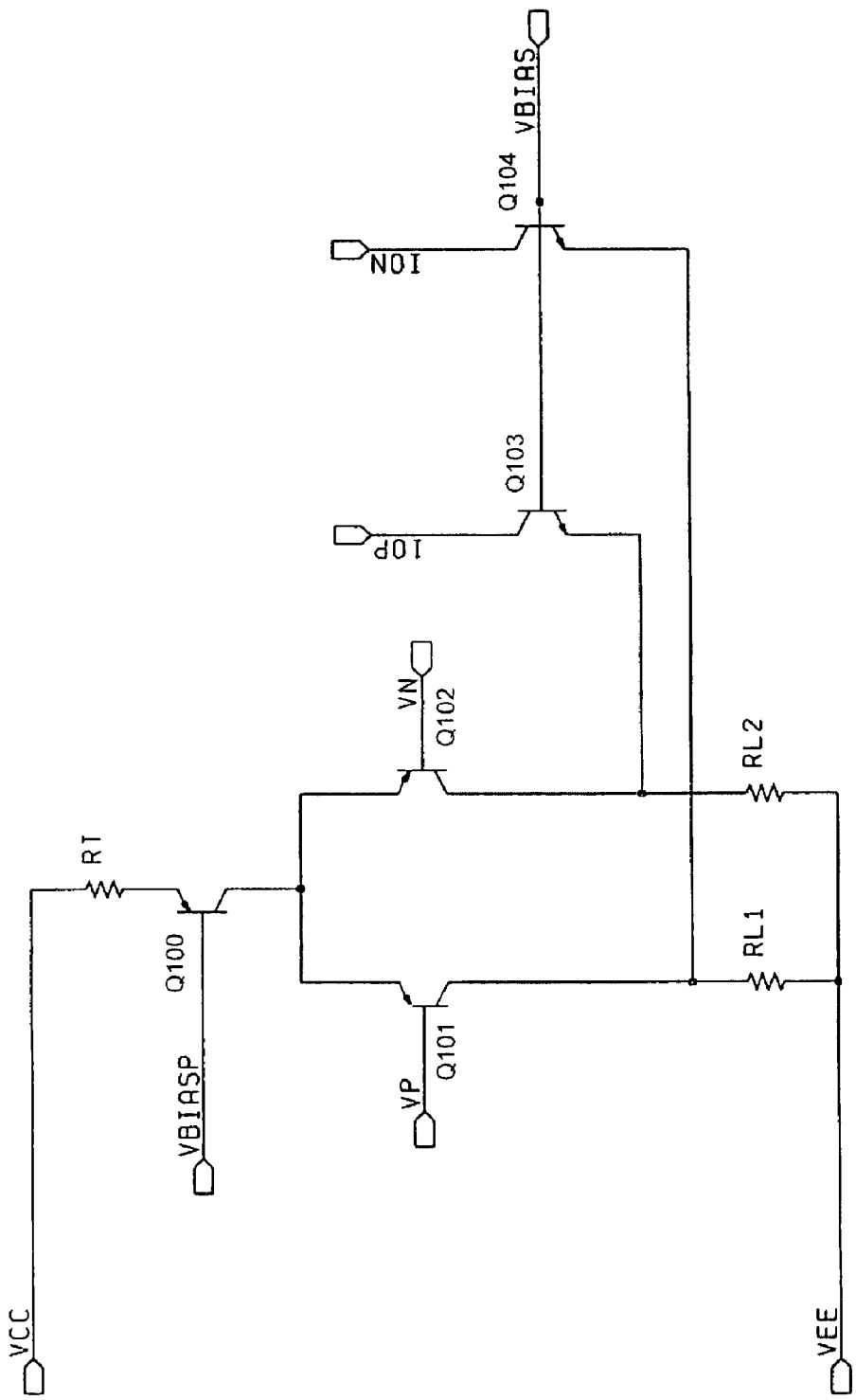
FIG. 1 shows an example of a prior art folded cascode trans-conductance cell.
Figure 2:
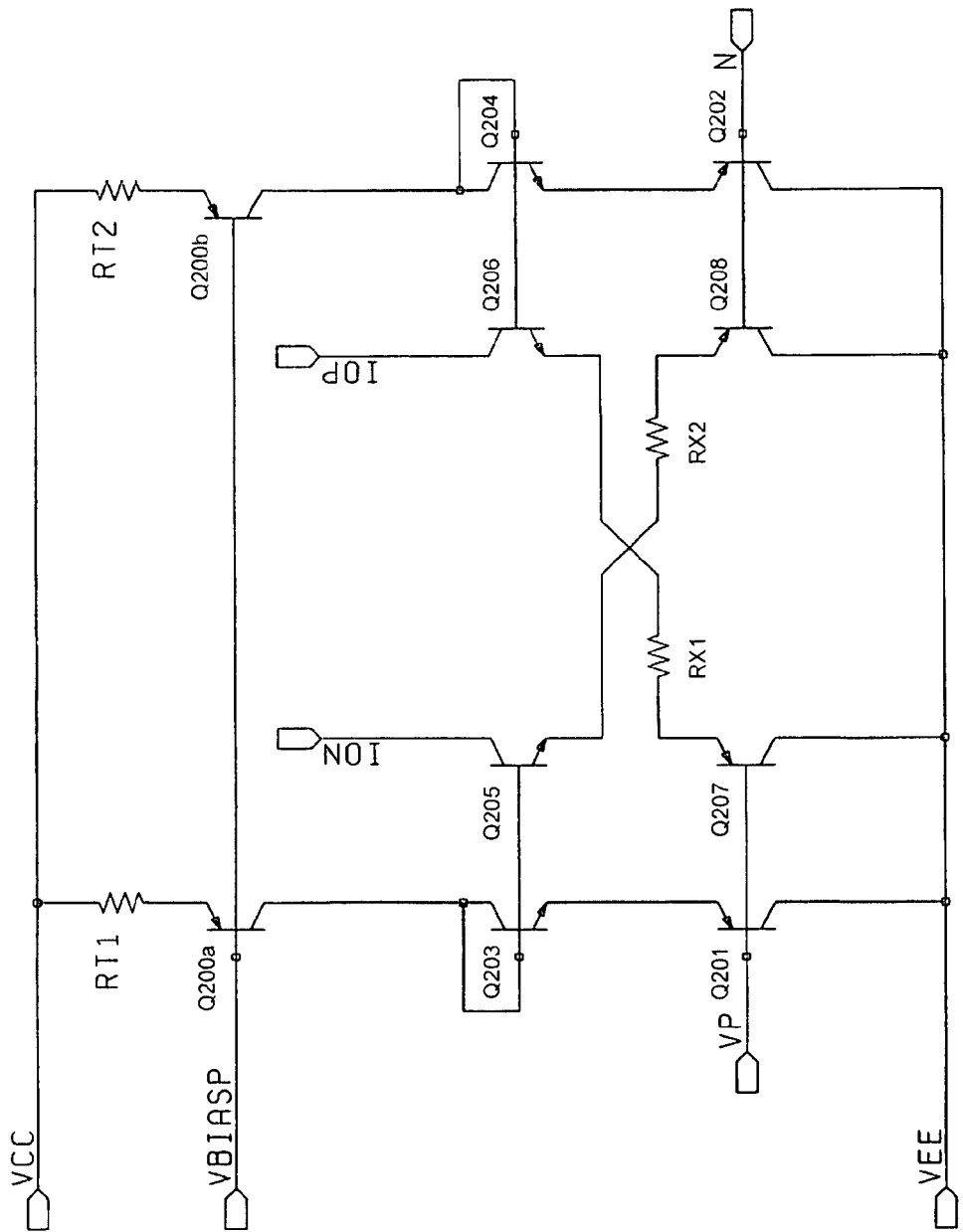
FIG. 2 shows an example of another prior art, an X-Bridge trans-conductance cell.
Figure 3:
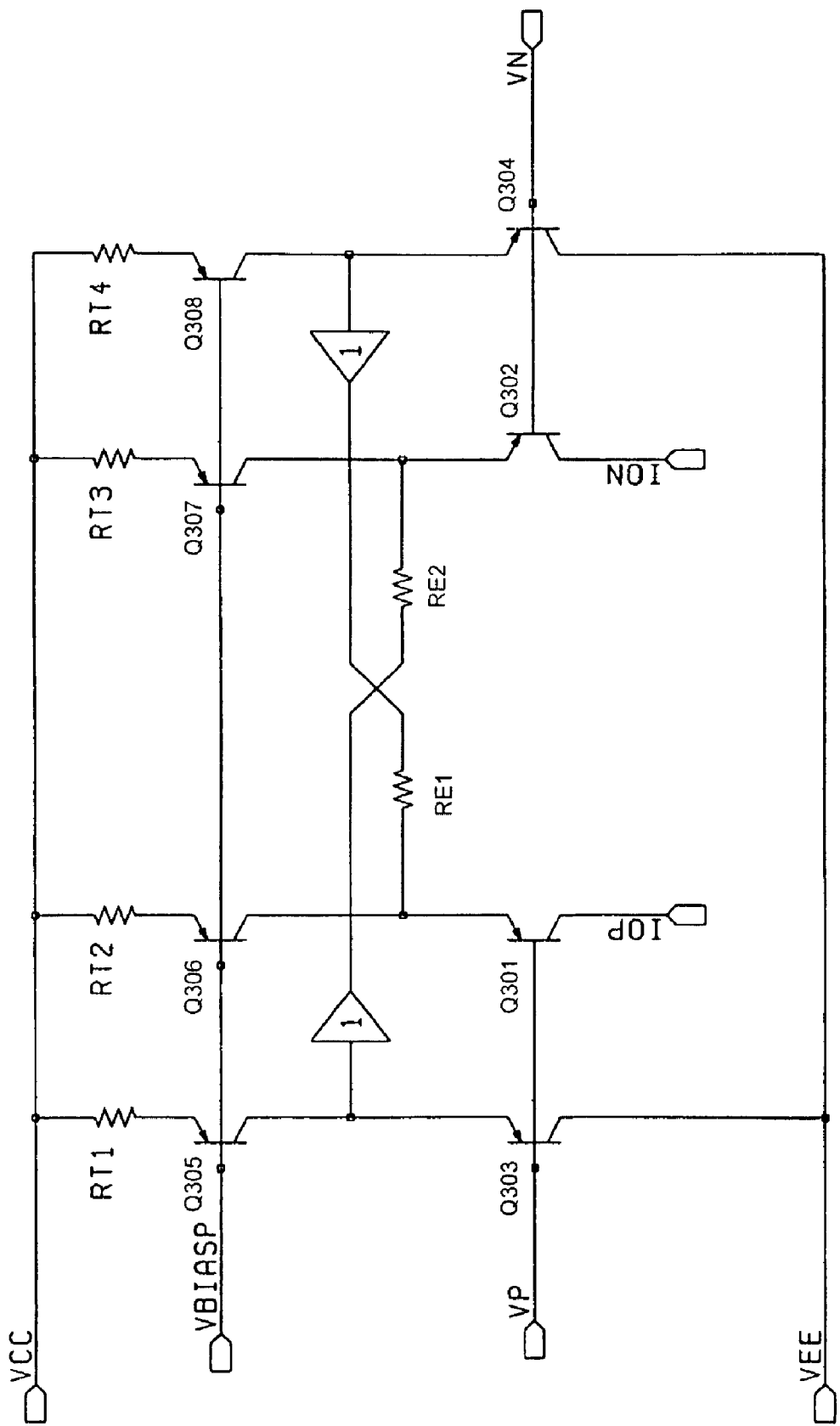
FIG. 3 shows one simple embodiment of a low headroom X-Bridge transconductance cell according to the present invention.

FIG. 3 shows a conceptual example of a Low Headroom X-Bridge transconductor input stage according to an embodiment of the present invention that is based on two modified differential pairs with single ended outputs. A source voltage follower arrangement configured as a unity gain voltage buffer has been added between resistors RE1 and RE2 and the outputs of two sink voltage followers, in this case, the transistors whose collector current is returned to the supply. This buffer provides high dynamic currents to the cell's output nodes in the presence of an input differential voltage $V_D=V_P-V_N$. Because the source voltage follower can provide unbounded output current, the output current of the transconductance cell theoretically is unbounded also. It is worth noting that the embodiment in FIG. 3 can be implemented using NPN transistors.

Figure 4:
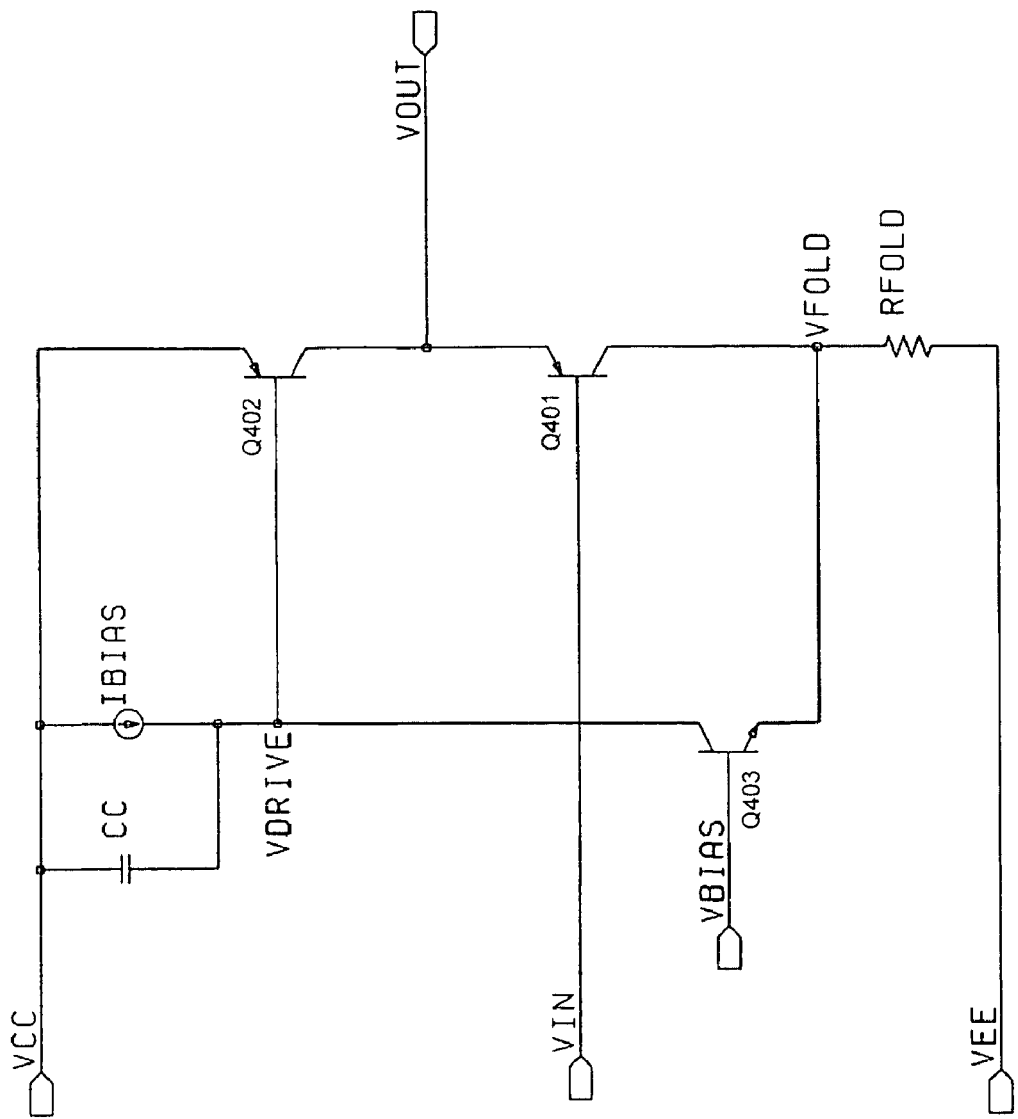
FIG. 4 shows an embodiment of a unity gain voltage buffer using a feedback structure.

A source voltage follower can be implemented using an active local feedback structure as shown in FIG. 4. In the static stable condition, bias current $I_{BIAS}$ flows through bias transistor Q403, some fold current $I_{RFOLD}$ flows through resistance $R_{FOLD}$, so the current through input transistor Q401 is therefore $I_{RFOLD}-I_{BIAS}$. Output terminal $V_{OUT}$ sources some output current, $I_{LOAD}$, and therefore current through drive transistor Q402 is $I_{RFOLD}-I_{BIAS}+I_{LOAD}$. The circuit has unity gain ($V_{OUT}=V_{IN}+V_{Q401BE}$) for any load current sourced out through $V_{OUT}$. This arrangement provides high dynamic source current capability, wide input dynamic range and low supply headroom requirements, which make it well suited for embodiments of the present invention.

It is worth noting that in embodiments such as the one shown in FIG. 3, the source voltage followers only need to source unbounded currents to achieve high output currents, which is a significant design consideration. If the source voltage follower does not impose any headroom limits, the trans-conductance cell in FIG. 3 can achieve a very wide input common mode range. The input can go beyond the power rail in one direction ($V_{EE}$ in FIG. 3) and up to $V_{RT}+V_{BE}+V_{CEsat}$ from the other ($V_{CC}$ in FIG. 3).

Figure 5:
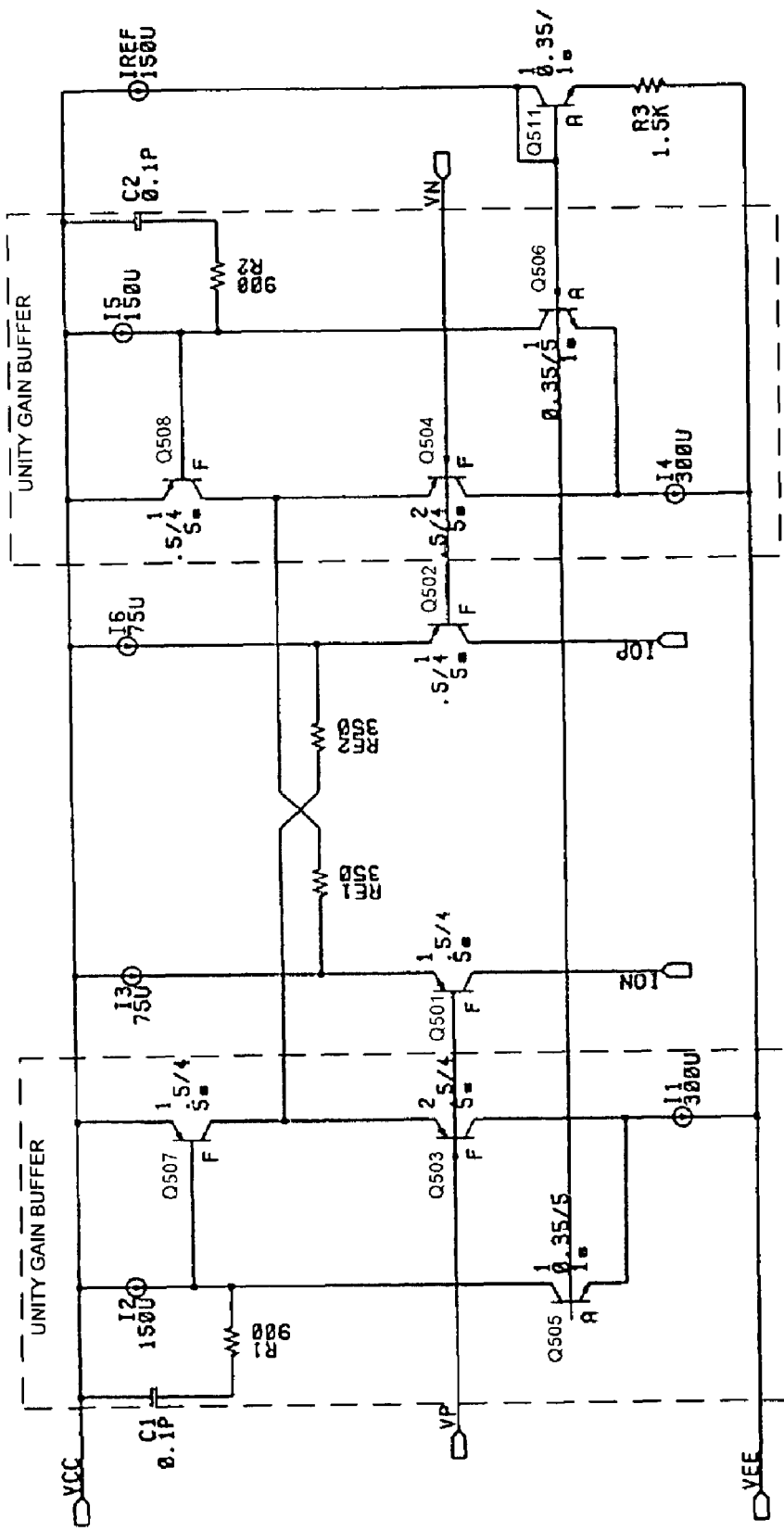
FIG. 5 shows one specific embodiment of a low headroom X-Bridge transconductor according to the present invention.

FIG. 5 shows one embodiment of a fully implemented Low Headroom X-Bridge transconductor cell employing the active local feedback source voltage followers shown in FIG. 4. Q501 and Q502 are respective positive and negative differential output current transistors which form the sink voltage followers. Q503/Q505/Q507 form the source voltage follower for the positive input $V_P$ and Q504/Q506/Q508 form a source voltage follower for the negative input $V_N$. The source voltage followers need to source relatively unbounded (very high) currents to achieve high output currents.

Although various exemplary embodiments of the invention have been disclosed, it should be apparent to those skilled in the art that various changes and modifications can be made which will achieve some of the advantages of the invention without departing from the true scope of the invention.

What is claimed is:

1. A trans-conductance cell comprising:
   a positive voltage rail for providing a positive power supply voltage;
   a negative voltage rail for providing a negative voltage power supply voltage;
   a pair of voltage inputs, one inverting and one non-inverting, for developing a differential voltage input signal having a common mode voltage range from one of the rail voltages to within a volt or less of the other rail voltage; and
   a pair of cross-coupled transconductor circuits, each transconductor circuit including:
   i. a source voltage follower responsive to one of the voltage inputs for sourcing relatively unbounded output current at unity voltage gain,
   ii. a sink voltage follower responsive to the other voltage input for sinking relatively unbounded output current to a current output terminal, and a transconductance resistor connected between the source voltage follower and the sink voltage follower for developing a differential output current proportional to the differential voltage input signal;
   iii. whereby transconductance of the cell is substantially constant over the range of the differential voltage input signal without limiting the differential output current.

2. A trans-conductance cell comprising:
   a positive voltage rail for providing a positive power supply voltage;

a negative voltage rail for providing a negative voltage power supply voltage;

a pair of voltage inputs, one inverting and one non-inverting, for developing a differential voltage input signal having a common mode voltage range from one of the rail voltages to within a volt or less of the other rail voltage; and a pair of cross-coupled transconductor circuits, each transconductor circuit including:
  i. a source voltage follower responsive to one of the voltage inputs based on an active local feedback arrangement, for sourcing relatively unbounded output current at unity voltage gain,
  ii. a sink voltage follower responsive to the other voltage input for sinking relatively unbounded output current to a current output terminal, and a transconductance resistor connected between the source voltage follower and the sink voltage follower for developing a differential output current proportional to the differential voltage input signal;

whereby transconductance of the cell is substantially constant over the range of the differential voltage input signal without limiting the differential output current.

3. A transconductor circuit according to claim 1, wherein the cross-coupled transconductor circuits are based on differential pair arrangements of transistor devices.

4. A trans-conductance cell comprising:

a positive voltage rail for providing a positive power supply voltage;

a negative voltage rail for providing a negative voltage power supply voltage;

a pair of voltage inputs, one inverting and one non-inverting, for developing a differential voltage input signal having a common mode voltage range from one of the rail voltages to within a volt or less of the other rail voltage; and a pair of cross-coupled transconductor circuits forming an input stage of an operational amplifier device, each transconductor circuit including:
  i. a source voltage follower responsive to one of the voltage inputs for sourcing relatively unbounded output current at unity voltage gain,
  ii. a sink voltage follower responsive to the other voltage input for sinking relatively unbounded output current to a current output terminal, and a transconductance resistor connected between the source voltage follower and the sink voltage follower for developing a differential output current proportional to the differential voltage input signal;

whereby transconductance of the cell is substantially constant over the range of the differential voltage input signal without limiting the differential output current.

5. A method for developing an input signal for an electronic device, the method comprising:

providing a positive power supply voltage at a positive rail;

providing a negative power supply voltage at a negative rail;

developing at a pair of voltage inputs, one of inverting and one non-inverting, a differential voltage input signal having a common mode voltage range from one power rail and to within a volt or less of the other power rail;

providing a pair of cross-coupled transconductor circuits, each transconductor circuit including:
  i. a source voltage follower responsive to one of the voltage inputs for sourcing relatively unbounded output current at unity voltage gain,
  ii. a sink voltage follower responsive to the other voltage input for sinking relatively unbounded output current to a current output terminal, and
  iii. a transconductance resistor connected between the source voltage follower and the sink voltage follower for developing a differential output current, developing the differential output current with the cross-coupled transconductor circuits so as to be substantially constant over the range of the differential voltage input without limiting the differential output current.

6. A method for developing an input signal for an electronic device, the method comprising:

providing a positive power supply voltage at a positive rail;

providing a negative power supply voltage at a negative rail;

developing at a pair of voltage inputs, one of inverting and one non-inverting, a differential voltage input signal having a common mode voltage range from one power rail and to within a volt or less of the other power rail;

providing a pair of cross-coupled transconductor circuits, each transconductor circuit including:
  i. a source voltage follower responsive to one of the voltage inputs using an active local feedback arrangement for sourcing relatively unbounded output current at unity voltage gain,
  ii. a sink voltage follower responsive to the other voltage input for sinking relatively unbounded output current to a current output terminal, and
  iii. a transconductance resistor connected between the source voltage follower and the sink voltage follower for developing a differential output current, developing the differential output current with the cross-coupled transconductor circuits so as to be substantially constant over the range of the differential voltage input without limiting the differential output current.

7. A method according to claim 5, wherein the cross-coupled transconductor circuits use differential pair arrangements of transistor devices.

8. A method for developing an input signal for an electronic device, the method comprising:

providing a positive power supply voltage at a positive rail;

providing a negative power supply voltage at a negative rail;

developing at a pair of voltage inputs, one of inverting and one non-inverting, a differential voltage input signal having a common mode voltage range from one power rail and to within a volt or less of the other power rail;

providing a pair of cross-coupled transconductor circuits forming an input stage of an operational amplifier device, each transconductor circuit including:
  i. a source voltage follower responsive to one of the voltage inputs for sourcing relatively unbounded output current at unity voltage gain,
  ii. a sink voltage follower responsive to the other voltage input for sinking relatively unbounded output current to a current output terminal, and
  iii. a transconductance resistor connected between the source voltage follower and the sink voltage follower for developing a differential output current, developing the differential output current with the cross-coupled transconductor circuits so as to be substantially constant over the range of the differential voltage input without limiting the differential output current.

9. An input circuit for an electronic device comprising:
means for providing a positive power supply voltage at a positive rail;
means for providing a negative power supply voltage at a negative rail;
means for developing at a pair of voltage inputs, one of inverting and one non-inverting, a differential voltage input signal having a common mode voltage range from one power rail and to within a volt or less of the other power rail;
means for providing a pair of cross-coupled transconductor circuits, each transconductor circuit including:
  i. a source voltage follower responsive to one of the voltage inputs for sourcing relatively unbounded output current at unity voltage gain,
  ii. a sink voltage follower responsive to the other voltage input for sinking relatively unbounded output current to a current output terminal, and a transconductance resistor connected between the source voltage follower and the sink voltage follower for developing a differential output current, and
  iii. means for developing the differential output current with the cross-coupled transconductor circuits so as to be substantially constant over the range of the differential voltage input without limiting the differential output current.

10. An input circuit for an electronic device comprising:
means for providing a positive power supply voltage at a positive rail;
means for providing a negative power supply voltage at a negative rail;
means for developing at a pair of voltage inputs, one of inverting and one non-inverting, a differential voltage input signal having a common mode voltage range from one power rail and to within a volt or less of the other power rail;
means for providing a pair of cross-coupled transconductor circuits, each transconductor circuit including:
  i. a source voltage follower responsive to one of the voltage inputs for sourcing relatively unbounded output current at unity voltage gain, wherein the source voltage follower including means for providing active local feedback to be responsive to one of the voltage inputs,
  ii. a sink voltage follower responsive to the other voltage input for sinking relatively unbounded output current to a current output terminal, and a transconductance resistor connected between the source voltage follower and the sink voltage follower for developing a differential output current, and
  iii. means for developing the differential output current with the cross-coupled transconductor circuits so as to be substantially constant over the range of the differential voltage input without limiting the differential output current.

11. An input circuit according to claim 9, wherein the cross-coupled transconductor circuits are based on differential pair arrangements of transistor devices.

12. An input circuit for an electronic device comprising:
means for providing a positive power supply voltage at a positive rail;
means for providing a negative power supply voltage at a negative rail;
means for developing at a pair of voltage inputs, one of inverting and one non-inverting, a differential voltage input signal having a common mode voltage range from one power rail and to within a volt or less of the other power rail;
means for providing a pair of cross-coupled transconductor circuits forming an input stage of an operational amplifier device, each transconductor circuit including:
  i. a source voltage follower responsive to one of the voltage inputs for sourcing relatively unbounded output current at unity voltage gain,
  ii. a sink voltage follower responsive to the other voltage input for sinking relatively unbounded output current to a current output terminal, and a transconductance resistor connected between the source voltage follower and the sink voltage follower for developing a differential output current, and
  iii. means for developing the differential output current with the cross-coupled transconductor circuits so as to be substantially constant over the range of the differential voltage input without limiting the differential output current.

* * * * *

UNITED STATES PATENT AND TRADEMARK OFFICE
CERTIFICATE OF CORRECTION

PATENT NO. : 7,800,445 B2 Page 1 of 1
APPLICATION NO. : 12/207082
DATED : September 21, 2010
INVENTOR(S) : Sandro Herrera et al.

It is certified that error appears in the above-identified patent and that said Letters Patent is hereby corrected as shown below:

In Col. 7, line 41
delete "wherein"

Signed and Sealed this

Twenty-first Day of December, 2010

David J. Kappos
*Director of the United States Patent and Trademark Office*